(12) United States Patent
De Luca et al.

(10) Patent No.: US 8,633,861 B2
(45) Date of Patent: Jan. 21, 2014

(54) WAVEGUIDE RADIATING ELEMENT OF AN ANTENNA SUITABLE TO OPERATE IN THE WI-FI BAND, AND SYSTEM FOR MEASURING THE PERFORMANCES OF AN ANTENNA OPERATING IN THE C BAND AND USING SUCH A RADIATING ELEMENT

(75) Inventors: Angelo De Luca, Rome (IT); Mattia Memoli, Rome (IT); Mario Teglia, Rome (IT)

(73) Assignee: Selex Sistemi Integrati S.p.A., Rome (IT)

( * ) Notice: Subject to any disclaimer, the term of this patent is extended or adjusted under 35 U.S.C. 154(b) by 226 days.

(21) Appl. No.: 13/297,758

(22) Filed: Nov. 16, 2011

(65) Prior Publication Data
US 2012/0119960 A1    May 17, 2012

(30) Foreign Application Priority Data
Nov. 16, 2010  (IT) ................................ RM10A0600

(51) Int. Cl.
  *H01Q 13/00*  (2006.01)
(52) U.S. Cl.
  USPC ............ 343/772; 343/756; 343/758; 343/909

(58) Field of Classification Search
  USPC .................................. 343/772, 756, 785, 909
  See application file for complete search history.

(56) References Cited

U.S. PATENT DOCUMENTS

| | | | | |
|---|---|---|---|---|
| 4,990,870 | A * | 2/1991 | Reindel | 333/208 |
| 7,889,149 | B2 * | 2/2011 | Diaz et al. | 343/785 |
| 2007/0024399 | A1 * | 2/2007 | Martin Antolin et al. | 333/205 |
| 2010/0156573 | A1 * | 6/2010 | Smith et al. | 333/239 |

* cited by examiner

*Primary Examiner* — Dieu H Duong
(74) *Attorney, Agent, or Firm* — Roberts Mlotkowski Safran & Cole, P.C.

(57) ABSTRACT

Structures and methods for a tunable waveguide radiating element are disclosed. The waveguide radiating element comprises a rectangular tube, which includes partially filled dielectric slabs that are disposed on parallel planes and incident on a lower edge of the element's mouth. The faces of each slab are engraved with a number of concentric SRR squares that present a gap on one of its sides. The distance between any two consecutive slabs may vary. The gaps of the outmost square may be arranged in such a way that, on the facing sides of two adjacent slabs, the gaps are rotated with respect to each other.

15 Claims, 7 Drawing Sheets

WAVEGUIDE RADIATING ELEMENT OF AN ANTENNA SUITABLE TO OPERATE IN THE WI-FI BAND, AND SYSTEM FOR MEASURING THE PERFORMANCES OF AN ANTENNA OPERATING IN THE C BAND AND USING SUCH A RADIATING ELEMENT

CROSS-REFERENCE TO RELATED APPLICATION

The present Application claims priority from Italian Application No. RM2010A000600 filed on Nov. 16, 2010, which is hereby incorporated by reference in its entirety into the present Application.

The present invention concerns a waveguide radiating element of an antenna suitable to operate in the Wi-Fi band, and system for measuring the performances of an antenna operating in the C band and using such a radiating element.

More in detail, the present invention concerns a waveguide radiating element suitable to irradiate, in particular in the C-band, even below is cut-off frequency (frequency of the radiating element, and therefore also of the antenna, which is composed by many elements), in particular in the Wi-Fi band about 2,450 GHz, by means of meta-material structures. In the specific case, for the mea-material structure, it has been chosen to utilize a particular configuration, so-called "Split Ring Resonators" (SRR), which, suitably loaded on guide, allows to lower its working frequency. The invention further concerns a measurement system for monitoring the detailed functional state of the transmitting-receiving modules ("TR Module" or TRM) within a phased array radar antenna, for example in the C-band; said system utilizes the radiant element according to the invention in a module substituting one of the antenna modules.

Typically, an active antenna of the phased-array type is constituted by a plurality of horizontal rows whereon a certain number of TRM modules is mounted which comprise corresponding radiating elements, each contributing to the creation of the electromagnetic beam.

In particular, in the AESA ("Active Electronically Scanned Antenna") systems, the antennae are based on multiple (hundreds, thousands) solid-state TRM modules and have by their own nature the possibility of varying their own radiation diagram during the normal operation to the end of facing intentional and unintentional disturbances, and adapting to the ambient conditions.

The TRM modules, comprising corresponding radiating elements, are placed along the rows resting on one another. Practically there is no space between them and between the antenna modules.

Each row of the antenna, so-called "row assy", is constituted by two half-rows and comprises also the control hardware. All this block is practically connected with the Horizontal Beam Forming Network (HBFN), network which allows the formation of the horizontal beam and serves to control the radio-frequency or "RF" on the modules.

Each module allocated in the row assy, in order to have a correct functioning, needs:
Receiving the supply voltages +5V, −5V and 8.4 V;
RF in TX and RX;
data for the beam formation;
controls for effecting the de-phasing in TX and RX.
All this is implemented with a connector dedicated to the passage of the RF and a connector dedicated to the exchange of the digital signals and o the distribution of the supply voltages.

In the following the bus signals are distinguished from the signals relevant to each module. The first ones are common to all the elements positioned on the same half row assy, the second ones are dedicated to each module.

The bus signals are:
DATA;
CLOCK;
ACT;
TRL.
The dedicated signals are:
Enabling of the data management and digital controls;
Enabling of the RF management.

When all the row assemblies are positioned on the antenna, both in the test phase and in the case any failure is detected, one needs to verify the status of the supplies on the modules, as to if these are controlled as required and if these are supplied correctly with the RF. Moreover, because of vibrations and oscillations, the behavior of the system itself can be different in the static condition (non-moving antenna) with respect to the dynamic condition (rotating antenna).

Currently a partial control is effected by means of BITE ("Built In Test Equipment") circuits, whose signals are suitably processed and sent o remote sites by means of slip rings of the rotating connection.

Differently, a deeper monitoring on the various control signals and other signalizations (temperature, calibration status, presence of RF, supply voltage etc.) would by the way the introduction of additional conductors dedicated to tests. The high number of signals, the high number of modules and their complexity would require a control system enough complex and expensive to be implemented once given the electro-mechanical constraints given by an already optimized structure. Indeed, with reference to FIG. 4, the space between the TRM modules is so reduced that it is not possible o house further connectors to implement the above-mentioned controls.

To obviate to the various encountered problems, one has found that an optimal solution is that of substituting one of the operative TRM modules with a probe module capable of transmitting via digital radio-link to a master measurement station the status of the control and bus signals, the temperature, the calibration status, the presence of RF and supply in the connector.

The radio-link between the antenna under test ("Antenna Under Test", AUT) and the suitable external modules operates in the Wi-Fi band around 2,4 GHz [21].

Owing to the various mechanical and electrical constraints, a little external antenna cannot be utilized which is placed on the AUT, but one must remain within one of the numerous modules (comprising the radiant elements) constituting the array, which, by the way, is protected by a suitable radome placed at few millimeters of distance from the radiating mouths of the radiating elements comprised in the TRM modules.

Since such radiating elements operates at a frequency much higher than that utilized for the Wi-Fi, the solution of the prior art can only be realized by making in such a way that it can operates in the required Wi-Fi band even if within housings dimensioned for the working band, in particular the C-band, and therefore operate below the cut-off frequency.

Such an ability, theoretically, can be actuated by means of loading the radiating element with a dielectric of suitable permittivity; as a matter of fact, however, this solution turned out to be hardly practicable and therefore in the prior art [21] there are researches with meta-materials for this solution.

FIG. 1 shows the reference model of structure known in the prior art, constituted by an only material layer composed of more subsequent cells, structure which allows to lower the cut-off frequency.

Structures have been utilized with a waveguide constituted by a rectangular tube 550 with parallel cells 510 (three rows), which allows to further lower the cut-off frequency (FIG. 2).

By using waveguides with Mu-negative (MNG) inclusions, "SRRs", one has obtained the possibility of propagating RF signals below of the typical cut-off frequency of the waveguide.

There is the necessity of optimizing the efficiency of such structures when these must irradiate in the free space, in particular widening the emission band, which turns out to be very narrow and therefore not much applicable in the cases of real interest.

In this connection, it is to be observed that in the paper [21] a reference is made to further researches to widen the band: "*At present time simulations and experimental activities to obtain an increment of bandwidth are in progress*" (p. 1264, right-hand column, 5$^{th}$ full paragraph), however clearly without specifying which technical solution one proposes to use and which results one would obtain.

Finally, other publications are known, which are of general interest in the field:

RUI YANG, YONGJUN XIE, XIADONG YANG, RUI 1-16 WANG, BOTAO CHEN ("fundamental modal properties of SRR meta-materials and meta-material based wave-guiding structures", OPTICS EXPRESS, vol. 17, no. 8, 31 Mar. 2009 (2009-03-31), pages 6101-61172);

ERENTOK A ET AL ("Characterization of a 1-16 Volumetric Meta-material Realization of an Artificial Magnetic Conductor for Antenna Applications", IEEE TRANSACTIONS ON ANTENNAS AND PROPAGATION, IEEE SERVICE CENTER, PISCATAWAY, N.J., US, vol. 53, no. 1, 1 Jan. 2005 (2005-01-01), pages 160-172);

Z. X. XU, W. G. LIN: "controllable 1-16 absorbing structure of meta-material at microwave", THE INSTITUTION OF ENGINEERING AND TECHNOLOGY, vol. 69, 2008,-2008, pages 117-125,4); and J. J. BARROSO, P. J. CASTRO, J. P. LEITE 1-16 NETO: "experiments on wave propagation at 6.0 GHz in a left-handed waveguide", MICROWAVE AND OPTICAL TECHNOLOGY LETTERS, vol. 52, no. 10, October 2010.

It is object of the present invention that of providing a waveguide radiating element, in particular an antenna radiating element, suitable to operate even below the cut-off frequency, and solves the problems and overcomes the drawbacks of the prior art.

It is further object of the present invention a system for the measurement of the antenna utilizing the radiating element that is object of the invention.

It is subject matter of the present invention a waveguide radiating element having a working frequency that is tunable below the cut-off frequency, the waveguide comprising a rectangular tube presenting a longitudinal axis and a rectangular mouth on a plane perpendicular to the longitudinal axis, the rectangular mouth comprising an upper and a lower edge, as well as lateral edges, the tube being partially filled with a MNG meta-material constituted by an integer number $N_l>2$ of dielectric slabs disposed on spaced apart and parallel planes, the parallel planes being incident on said lower edge of said mouth, each slab having engraved on each of its faces an integer positive number $N_{SSR} \geq 1$ of concentric SRR squares, each SRR presenting a gap on one of its sides, wherein:

It is present a supply pin having a height $h_p$;
The working band $[f_{l1}, f_{l2}]$ is a function of $N_l, d_l, h_p, N_{SSR}$;
The waveguide radiating element being characterized in that:
The distance $d_l$ between any two consecutive slabs of said $N_l$ dielectric slabs is not always equal, i.e. the slabs are not uniformly distributed along the direction of said lower edge;
Said number NSSR of SSR squares present the arrangement of the gaps of the outmost square in such a way that, on the facing sides of two adjacent slabs, such gaps are rotated, with respect to each other, of 0°, or 90°, or 180°, or 270° with respect to an axis a orthogonal to said two slabs, and in that the gaps of at least two of said number $N_{SSR}$ of SSR squares are rotated of an angle different from 180°.

Preferably according to the invention, the working band $[f_{l1}, f_{l2}]$ is the Wi-Fi band.

Preferably according to the invention, each slab protrudes from the lower edge of said mouth towards outside said mouth, in the direction of said longitudinal axis, by a distance s comprised between 1.5 and 4.0 mm.

Preferably according to the invention, $N_{SSR}=3$.

Preferably according to the invention, $N_l \geq 5$.

Preferably according to the invention, said $N_l$ slabs comprise outmost slabs along the direction of said lower edge, and one or more internal slabs between said outmost slabs, said outmost slabs protruding from said lower edge towards outside to an extent larger than that of said internal slabs.

Preferably according to the invention, the central frequency of the working band $[f_{l1}, f_{l2}]$ is inversely proportional to $h_p, d_l, N_l, N_{SSR}$.

Preferably according to the invention, said distance $d_l$ is, each time for each pair of consecutive slabs, equal or a multiple of a pre-determined basic distance.

Preferably according to the invention, said distance $d_l$ has a value $d_{l1}$ comprised between 1.2 and 1.7 mm for said internal slabs and a value $d_{l2}$ comprised between 1.5 and 4.5 mm between the most external slabs of said internal slabs and said two outmost slabs.

Preferably according to the invention, $h_p$ is comprised between 8 and 10 mm.

Preferably according to the invention, said slabs are disposed on planes transversal to the direction defined by said lower edge.

The disposition of the slabs on transversal planes is the best disposition since the slabs are parallel to the magnetic field. If the slabs were horizontal, the radiating element would not function, because there would be no concatenation with the magnetic field. They can however be oblique, with less effectiveness, solving in any case the technical problem of the invention.

Preferably according to the invention, it is present a short-circuit placed behind said supply pin.

Preferably according to the invention, the fundamental mode corresponding to the working frequency is excited by means of a guide-cable transition using a coaxial connector that is orthogonal to the waveguide, or by means of a guide-cable transition with a coaxial connector along the longitudinal axis of the waveguide and flush to the central slab of said $N_l$ dielectric slabs, and with the pin closed towards earth.

It is further subject matter of the present invention a system for measuring programming and control parameters of a phased array antenna constituted by a plurality of TRM modules, characterized in that it uses one or more test TRM modules each comprising a waveguide radiating element that transmits signals relevant to programming and control antenna parameters, in particular relevant to the presence and intensity of the radio-frequency, bus and control, supply voltage and temperature, the waveguide radiating element emitting outside the antenna's band, said one or more test TRM modules being installed in place of a corresponding subset of said plurality of TRM modules of the antenna, the system comprising means for receiving signals that comes from said one or more test TRM modules and means for the transmission of said signals to a electronic elaboration unit, the waveguide radiating elements of said one or more test TRM modules being waveguide radiating elements according to the invention.

Preferably according to the invention, said means for receiving signals are constituted by a receiving element placed on a mechanical arm that is integral to the rotating part of the phased array antenna, in particular to the calibration probe of the antenna.

Preferably according to the invention, said means for receiving signals are constituted by more fixed stations distributed on a round angle around the antenna, each comprising a receiving element.

The present invention will be now described by way of illustration but not by way of limitation, but not by way of limitation, with particular reference to the figures of the annexed drawings, wherein.

The solution of the above mentioned test module is useful to affect the appropriate controls even when radar antenna is rotating. In such a case, it is necessary to dispose of measurement system which allows to interrogate the antenna and to receive the data relevant to the status of bus and controls, and the other signals, in any position of the antenna during the rotation.

Figure 10:
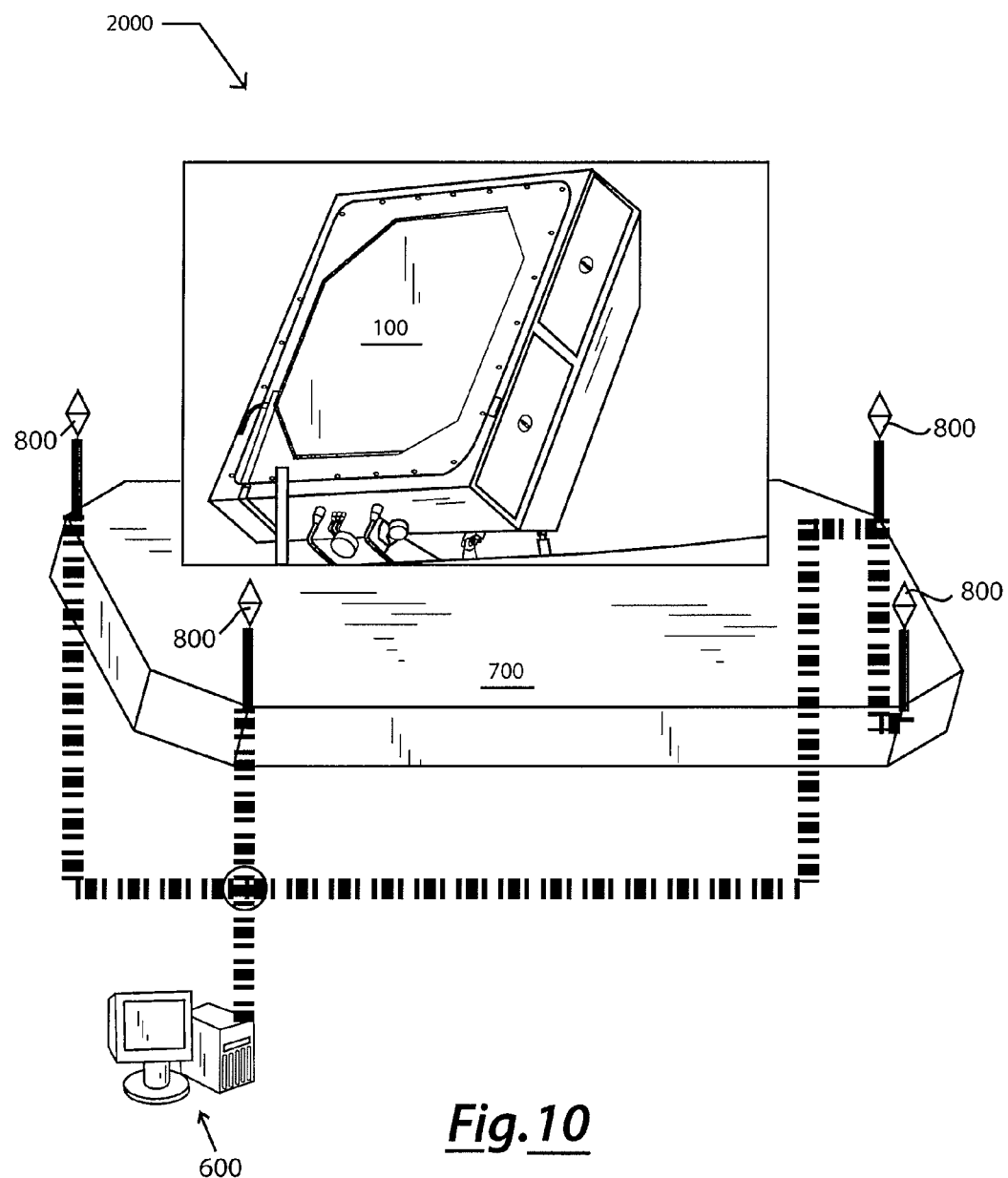
FIG. 10 shows a second preferred embodiment of the measurement system according to the invention.

It is therefore necessary that:
 the test module, or the probe, be provided with an antenna capable of the radiating when this is inserted in the array;
 one disposes of a receiving system constituted by for example for sites at 90° with respect to one another so as to cover the 360° scanned by the antenna during its rotation as in FIG. 10;
 alternatively, it is possible to use a probe positioned before the antenna and integral with it by means of a mechanically arm to perform the exchange between the test module(s) inserted in the antenna and the master control: the data transmission will occur through the slip ring at the base of the antenna;
 one disposes of a master station capable of storing the data received through the radio link by means of one of the above mentioned receiving systems.

Figure 9:
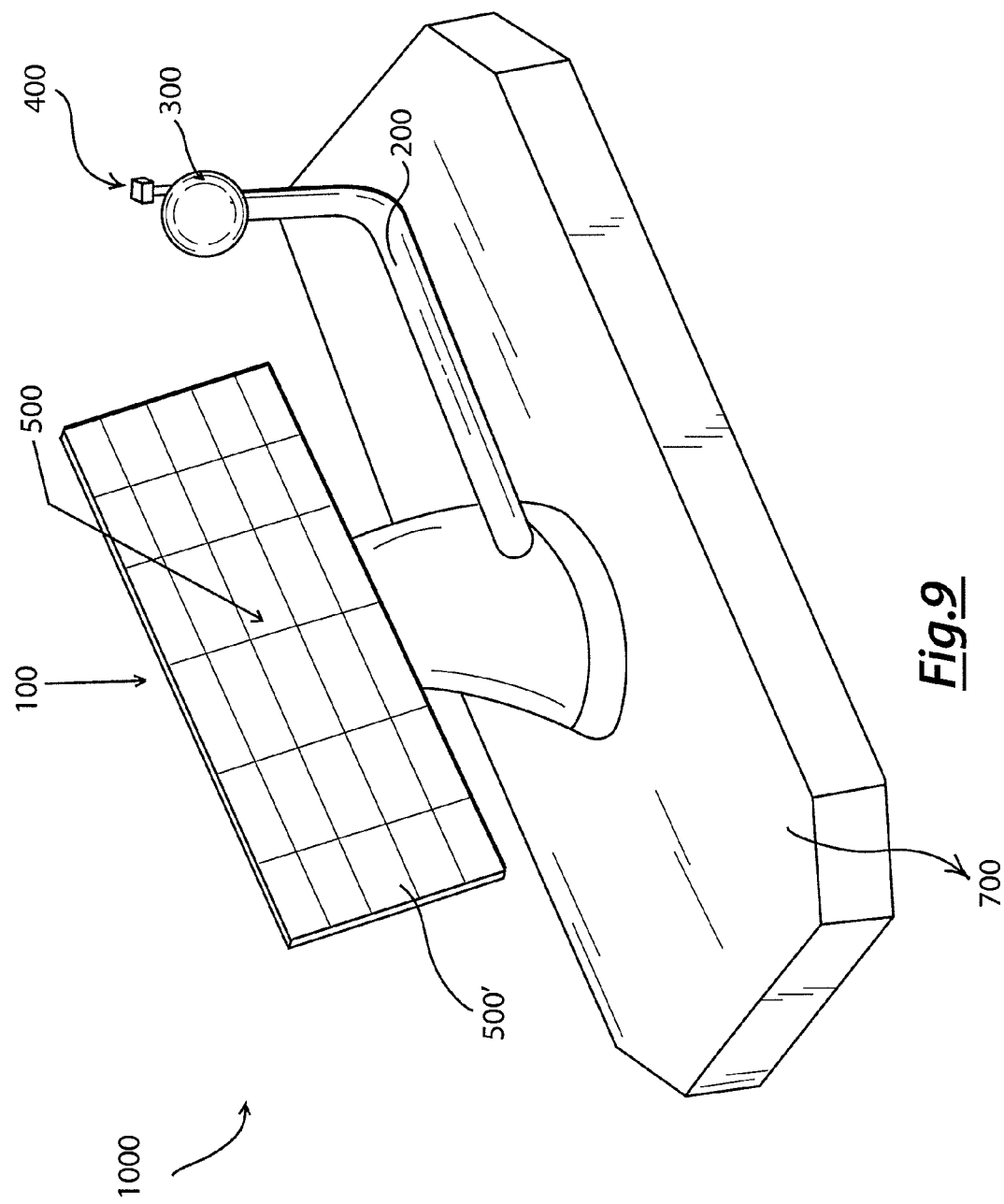
FIG. 9 shows a preferred embodiment of the measurement system according to the invention.

FIG. 9 illustrates this situation: the antenna assembly 1000 comprises a base 200 and a rotating antenna 100, wherein there is the test radiating element 500 transmitting the measurement data. To the antenna 100, an arm 200 is integrally fixed, which brings a calibration probe 300 at its free end. Close to this probe 300, a receiving unit 400 is fixed which receives the signals sent by the test radiating element 500 according to the invention (the other radiating elements according to the invention are indicated with 500').

FIG. 10 illustrates a further embodiment of the system 2000 and wherein is one disposes of four receiving devices located at the edges of the platform antenna in their positions 0°, 90°, 180° and 270°. The antenna system assembly 1000 comprises to the rotating antenna 100 on the base 700 whereon for example the receiving Wi-Fi radio devices are located along the four cardinal directions connected to the master station 600.

In order to implement the solution according to the invention, it has been necessary to find a particular solution which allows to irradiating in such a band, whilst the module keeps inserted in that framework of the array.

To this end, solutions of printed radiating elements have been evaluated, typically utilized for application of this type (for example the Printed Inverted F Antennae or "PIFA").

The analyses, which have been carried out by means of suitable electromagnetic simulator on such radiators the house and in the available small volume, is in a place of a radiating element of the array, and has unfortunately revealed radiating behaviors that are ineffective and barely applicable to the proposed aims.

As a consequence, one has evaluated the choice of an array module with waveguide radiating element, suitably modified to allow it to operate on frequencies much below the cut-off frequency.

Figure 1:
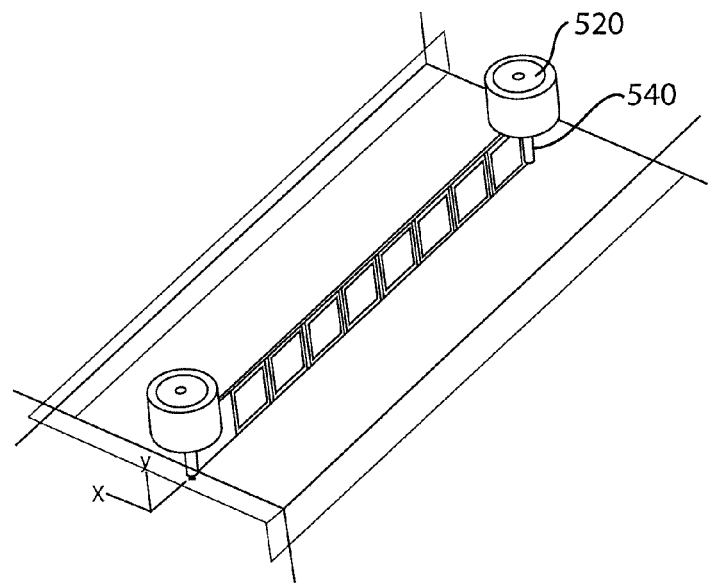
FIG. 1 shows the geometry of the reference structure as considered in the prior art for the analysis of the propagation of the RF in the presence of a meta-material.

A modification of such type is quoted in literature [21] is and has been above illustrated with reference to FIG. 1, but its effectiveness comes out to be insufficient for the cases of practical interest.

The objects sought in the research for the present invention, concerning the radiating aspect and a particular application of the AESA antennae, are:
A good gain;
High efficiency;
Low return loss;
Suitable bandwidth close to f=2.450 GHz.

In fact, although it is referred here to the C band, the technical concept underlying the present invention comes out to be applicable to any band and with respect to any reference frequency. Indeed, the relevant tests have been performed, which will not be described here not to make the description heavier.

Figure 2:
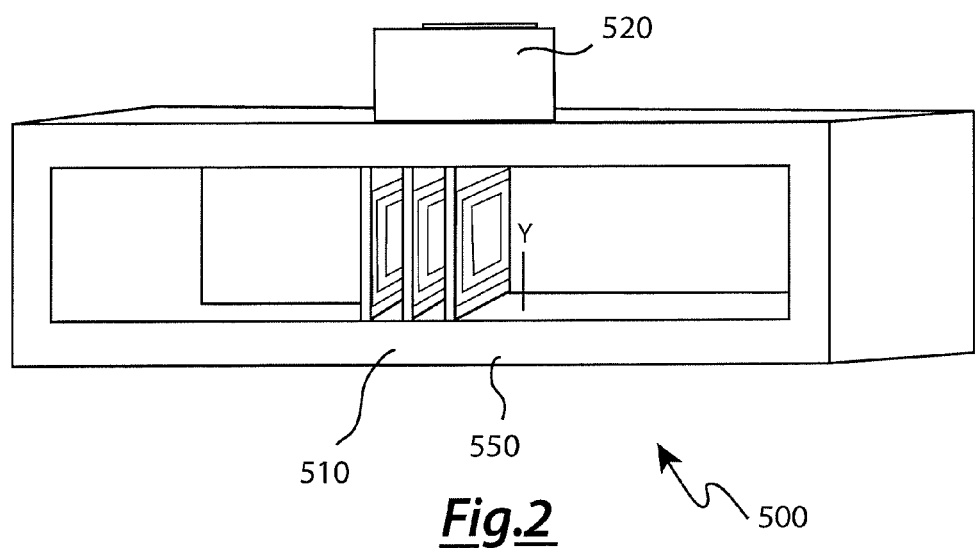
FIG. 2 shows a further variation constituted by a configuration with three slabs having a single cell with three concentric SRR squares, according to a prior art.

Making reference to FIG. 2, to better understand the phenomenon in the radiation, it has been chosen to simulate the single-cell structure with three dielectric slabs spaced apart with respect to each other by 1.5 mm, each one having three SSR concentric squares engraved on both faces (FIG. 6); the fundamental mode is excited by means of a transition in a coaxial cable orthogonal to the guide, which is placed flush with the dielectric slab (slap with photo-engraved SSRs).

The slabs, in an embodiment according to the invention, protrudes by s=3 from the lower edge 551 of the mouth of the guide; the choice has been forced by the presence of a radome placed at a distance of 4 mm from the phased array, which practically, besides the protective function, has also on the task of adapting the active impedance of the single guides (i.e. in presence of mutual coupling) within the sector of electronic scanning of the beam.

In radiation, the response of the obtained return loss (S11) shows a resonance in correspondence of the frequency f=1.935 GHz with minimum value of −14.25 dB.

Despite the good value of return loss, such a configuration does not allow to obtain what had been sought at the beginning for the following reasons:
the resonance frequency is lower than that desired for the transmission;
the radiation efficiency is very low, equal to around 12%;
The realized gain (that is the effective gain understood as directivity depurated from the ohmic and mismatch leakages) is below 0 dBi, precisely equal to −6.032 dBi.

In the subsequent step, therefore, modification to the examined structure has been made for achieving the pre-determined objects, such as:
better adaptation to the transition;
Increase of the radiation efficiency as obtainable by an increase of the number of dielectric slabs, place parallel one after the other.

Firstly one has varied the dimensions of the pin 540 (indicated in FIG. 1 and not represented in the other figures), that is the central conductor of the coaxial connector 520, indicated in FIG. 2, of the waveguide of the module 500. Indeed, by reducing its height, the structure under examination comes out to be better adapted (the reflection is reduced).

From table 1 one can see that, bringing the pin height to 9.2 mm, one obtains an only resonance at 2.806 GHz with return loss of −18.93 dB.

TABLE 1

| Pin height | Resonance freq. | | return loss (dB) | |
|---|---|---|---|---|
| (mm) | I | II | I | II |
| 12.5 | 1.935 | 2.730 | −3.98 | −3.5 |
| 12.14 | 2.526 | 2.728 | −2.93 | −4.05 |
| 11.78 | 2.542 | 2.728 | −3.82 | −4.40 |
| 11.42 | 2.552 | 2.733 | −4.417 | −4.23 |
| 11.06 | | 2.569 | | −5.227 |
| 10.7 | | 2.574 | | −6.32 |
| 9.2 | | 2.806 | | −18.93 |

A further advantage, obtained by having reduced the pin height, concerns the gain and efficiency: by reducing the pin to 9.2 mm, the structure has a realized gain of 2.43 dBi (gain with respect to an isotropic antenna) and the radiation efficiency close to 91% in case of an isolated element (therefore not inside antenna modules array).

It is to be noted, in this connection, that the radiation efficiency increase is essentially connected to the fact that one has a resonance frequency shift upwards, whilst the total efficiency benefits from the better impedance adaption.

Figure 3:
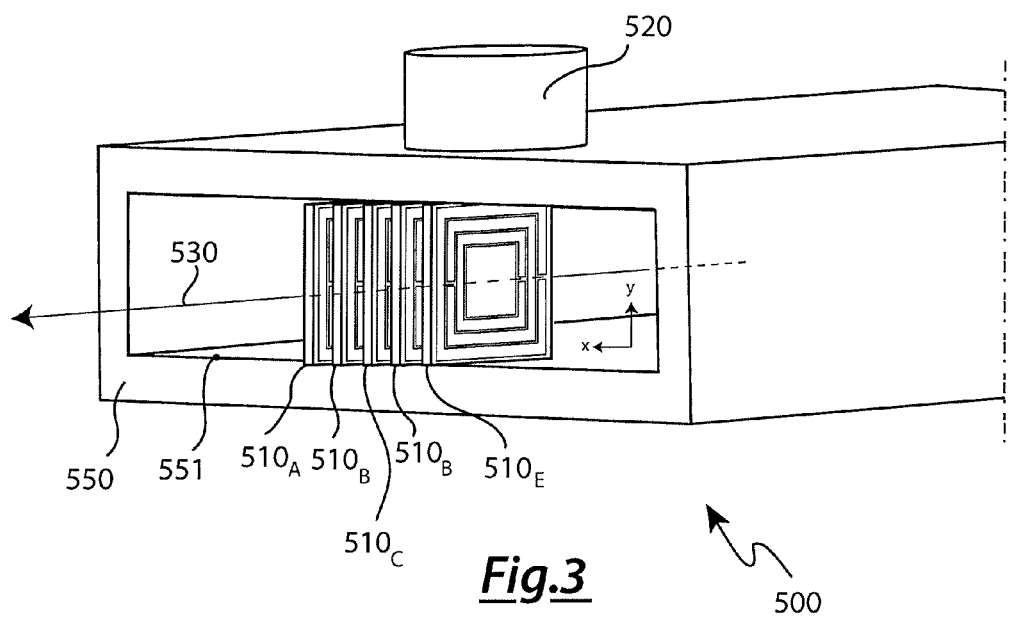
FIG. 3 shows a guide loaded with five single-cell slabs, according to the invention.

By acting only on the pin height, as one can observe in the previous table, one is not able to make the guide irradiate at the desired frequency; the attempt made in the research for the present invention in order to lower the resonance has been that of adding other two photo-engraved, single-cell, dielectric slabs, which are also spaced apart of 1.5 mm along the same direction of the edge 551 of the mouth of the waveguide, as shown in FIG. 3.

The waveguide with dielectric slab behaves as the well-known ridge guide. By further increasing the slabs number, one succeeds to limit the field in the centre of the guide, wheat subsequent lowering of the antenna resonance frequency.

By keeping the pin height at 9.2 mm and bringing to 5 the number of single-cell cell slabs, the resonance drops by around 400 MHz till it arrives at 2.405 GHz with return loss of −20.1 dB; even in this case, one obtains a good gain and high efficiency of radiation, respectively of 2.16 dBi and 83.7%.

This configuration, as can be observed, allows to come very close to the desired result: thanks to the presence of multiple meta-material slabs one arrives therefore to increase the radiation efficiency, and therefore the guide gain, and to have a tuning element constituted by the distance between the slabs, with which it is possible to exactly tuning the end the resonance frequency of 2.450 GHz.

It has been further observed that by reducing or increasing the distance separating the slabs, one is able to shift the resonance frequency upwards or downwards.

Which reference to table 2, one can observe that by increasing the distance between the slabs up to 2 mm, the structure resonates at the desired frequency, that is at 2.450 gigahertz, although despite a reduction of efficiency and therefore gain.

TABLE 2

| Slabs distance (mm) | Resonance freq. (GHZ) | realized Gain (dB) | rad. efficiency |
|---|---|---|---|
| 1 | 2.385 | 2.74 | 0.8271 |
| 1.5 | 2.405 | 2.67 | 0.9353 |
| 2 | 2.447 | 1.99 | 0.8097 |

By loading the single guide under examination, operating in the C band, with single-cell dielectric slabs, photo-engraved with three SRRs, one is able to lower the cut-off frequency to the desired value, i.e. to 2.450 gigahertz.

The number of SRRs can vary as well, and the effect of this change, when also the other parameters are varied, can be verified exactly with the above-mentioned tests. It is clear here that the technical concepts of utilizing multiple side-by-side slabs brings with it many possibility concerning the tuning of the resonance frequency and the gain, possibilities that depend on the tuning of other parameters of the physical structure (pin height, dielectric slab structure, disposition of the slabs) that can be determined each time for example according to the described procedure.

The corresponding radiation pattern shows that the antenna he radiates mainly in a sector around its mechanical axis, but also in the rear zone.

The presence of the back lobe, which finds lower than the main lobe, is not to be attributed to the irradiation of the guide, which in the case under examination does not present the classical short circuit behind the pin of the coaxial, because, along such direction, one has not the phenomenon of the so-called evanescent waves that are strongly attenuated; such an irradiation is instead to be attributed to the fact that the radiating opening is small in terms of λ and therefore all the structure irradiates in the various directions, included the rear sector.

To the end of verifying what has been just stated, the structure of interest has been stimulated by making it protrude from a ground plane.

The obtained results confirmed what above stated; particular, one observes a consistent a reduction of the back radiation, that, however, is not completely eliminated because of the occurring of the phenomenon of diffraction from the plate edges; the back lobe is thus strongly reduced, and the actual gain reaches a value of the order of 6 dB in the absence of the metallic plane.

One derives that the problem of the back radiation can be limited by inserting the guide, suitably loaded, in the phased array, that for the Wi-Fi band is see practically as a continuous metallic wall.

Figure 4:
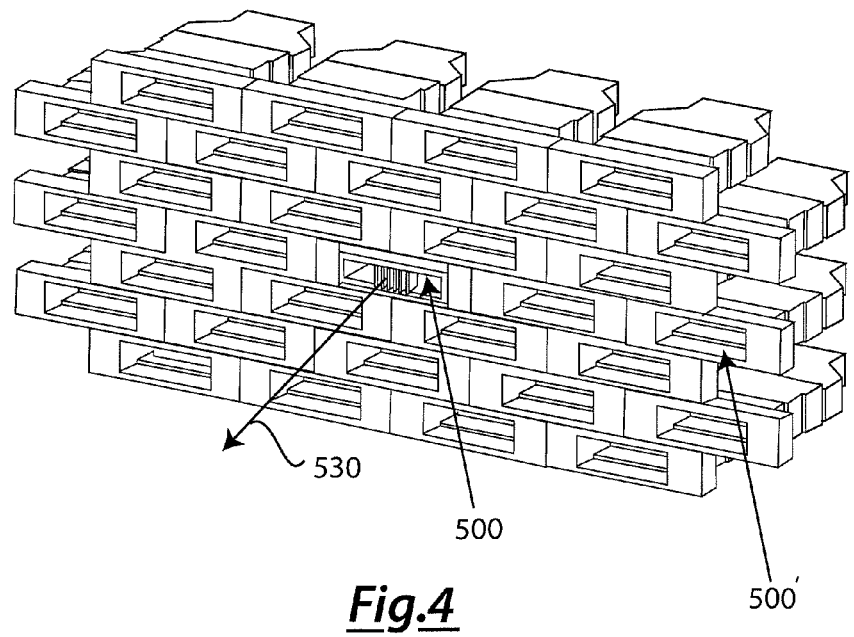
FIG. 4 shows the insertion of the guide according to the invention, suitably loaded, in the fully active phased array.

The last step of the research comprises the insertion of the module including the suitably loaded waveguide radiating element into the fully active phased array with reference to FIG. 4.

The results have been illustrated, that has been obtained for the guide loaded with five dielectric slabs, spaced apart of 2 mm with respect to each other, each one being a single cell and having three concentric SRRs engraved the both faces; owing to the fact that such a structure, singularly, allows to work at 2.450 GHz, it has been decided to simulate the transmission with the insertion of the guide in the phased array (in fact, due to calculation limitations, one has considered to a limited portion of array, see FIG. 4).

The insertion of the guide into the array entails a lowering of the resonance to the frequency of 2.356 gigahertz and a worsening of the adaptation; probably, such a variation is to be attributed to the direction of the structure with the adjacent guides.

Trying to bring back the working frequency to 2.450 GHz, one proceeded in the following way:
  One modified the pin, in order to adapt the antenna;
  a short circuit has been introduced in the guide, behind the supply pin, utilized as tuning element in order to centre the frequency of interest.

In this case the pin has been brought to 10 mm, while the short circuit is placed at 9.8 from the photo-engraved slabs.

Figure 5:
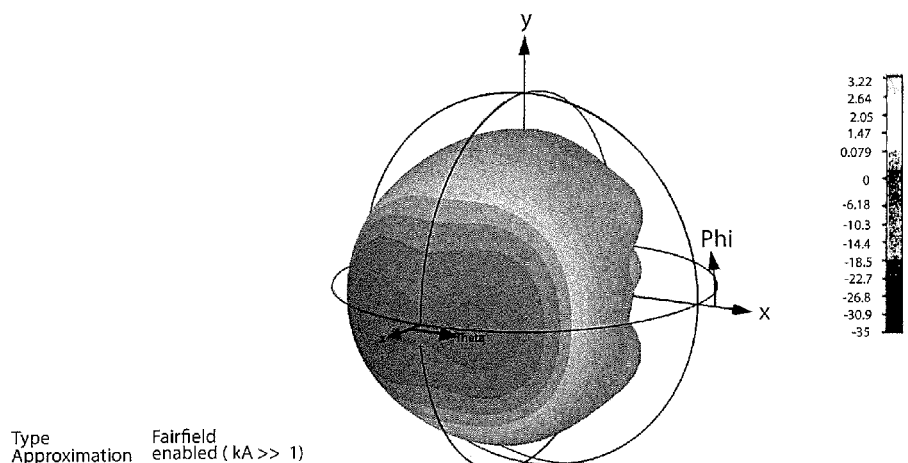
FIG. 5 shows the guide radiation pattern according to the invention when inserted in the array.

The results of the simulation are quoted in FIG. 5.

Such arrangements allow to centre exactly the working frequency to the desired value (i.e. 2.450 GHz); further advantages obtained by the present configuration are:
  Good return loss (−20.27 dB);
  High irradiation efficiency (around 81%);
  increasing of the "actual" gain to 5.51 dBi;
  Further reduction of the back lobe.

This solution allows to make a waveguide, inserted into an array operating in the C band, operating in the Bluetooth band (inefficient way but with narrow band). These improvements however do not concern the emission bandwidth which is of fundamental importance.

Figure 7:
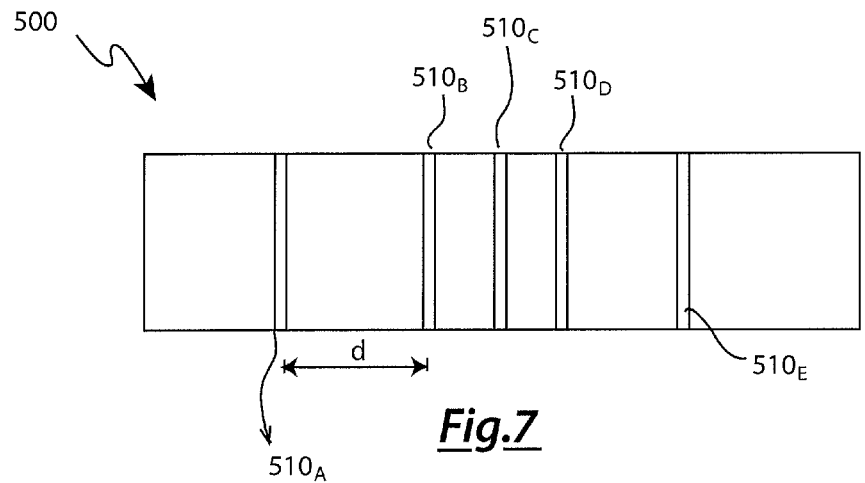
FIG. 7 shows the multiple-slab configuration as utilized for obtaining the graph of FIG. 8.
Figure 6:
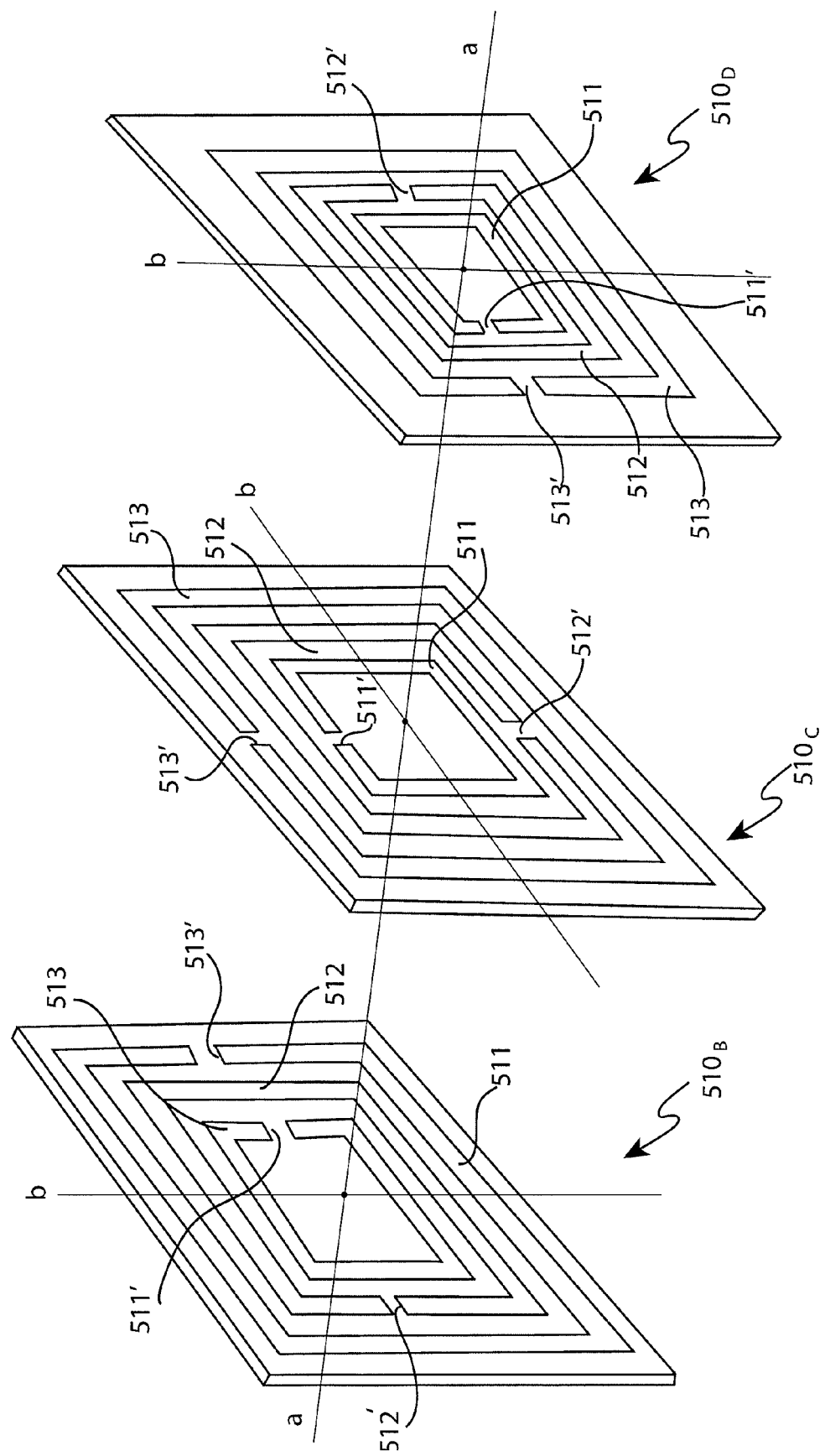
FIG. 6 shows the disposition of the slabs in the radiant element according to the invention.

In order to widen the emission band, according to the invention, the slabs has been adequately disposed into the waveguide of the module 500, as in FIG. 6, in the disposition according to FIGS. 7. In the specific example, five slabs 510A, 510B, 510C, 510D, 510E are present, which are not uniformly spaced apart with respect to each other, indeed the distance between the slabs 510B, 510C, 510D is more than the distance between the slabs 510A, 510B on one side and 510D, 510E on the other side. The fundamental mode corresponding to the working frequency is excited by means of a guide-cable transition with coaxial connector 520 orthogonal to the guide, as illustrated in the example of FIG. 3.

Each cell (slab) is constituted by three concentric split-rings (SRR) on each face of the slab. The split-rings are in turn configured with the alternate split or "gap" (cut) 511', 512', and 513'.

More in detail, the SRRs 511, 512, 513 of two adjacent slabs (only three ones are represented in FIG. 6) are rotated by 0°, or a 90° or 180° or 270° with respect to an axis "a" orthogonal to the slab (in FIG. 6, the rotation is of 90°, the visible faces are at those which does not face one against the other, however the non-visible side of the slabs is the same of the visible one as rotated by 180° with respect to the axis "b" perpendicular to the axis "a".

In a first embodiment, the split-rings of at least two adjacent slabs are rotated by 90°.

In a second embodiment, the split-rings of at least two adjacent slabs are rotated by 180°.

Moreover, in a third embodiment, the two external slabs 510A, 510E, of the group of the five slabs 510A, 510B, 510C, 510D, 510E protrude, with respect to the edge 551 of the mouth of the waveguide 550, more than the three internal slabs 510B, 510C, 510D, and this father widen the band, and, together with the rotation of the SRRs, improves adaptation of the impedance.

Figure 8:
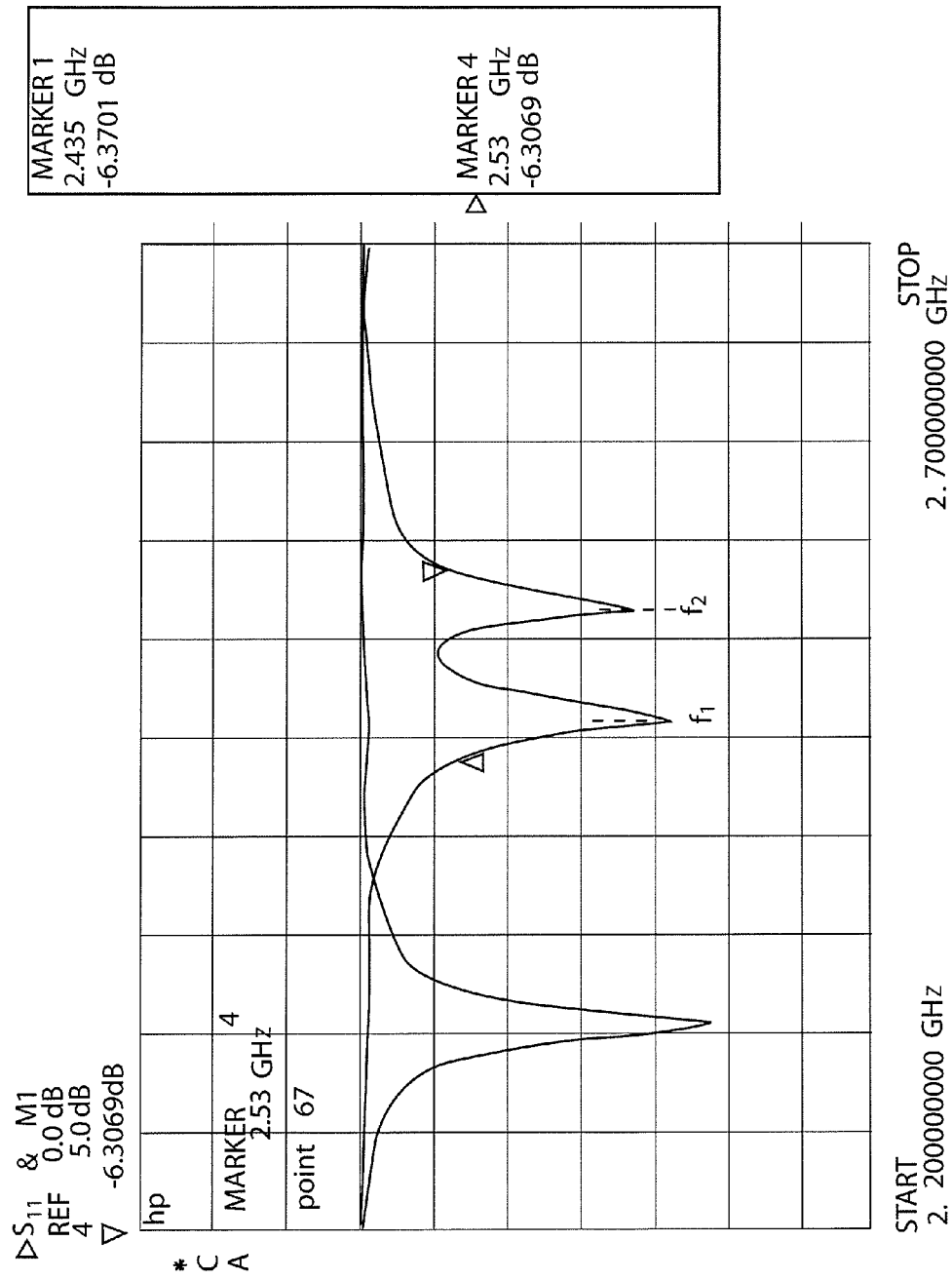
FIG. 8 shows the parameter S11 of the loaded waveguide according to the invention with rotation of the spirit rings, when inserted in the phased array.

In FIG. 8, one sees the effect of the above-mentioned rotation of the split-rings on the parameter Sll as referred to the level of around −6 dB, in the case of a waveguide with 5 parallel slabs (disposed in such a way that the distance between the two end slabs 510A, 510E and the central slabs 510B, 510C, 510D is different from the distance between the central slabs themselves) each one with three concentric rings. The presence of the resonance at $f_2$ is due to the fact that the two indicated slabs are slightly protruding more than the two other ones (the bandwidth and adaptation is very sensible to the value of two protrusion, which is calculated with respect to the lower edge 551 of the mouth of the waveguide which he is a rectangular tube cut perpendicularly to its axis, see FIG. 3). Taking into account that the first resonance depends on the position of the short circuit, one can widen the band by creating a second resonance in a suitable way by acting on the configuration of the slabs as above described.

In conclusion, the use of particular, suitably configured, meta-material structures has permitted to use, as antenna for the Wi-Fi transmission-reception, a probe module in place of the generic radiating element of the array under test. Moreover, the choice of a total original configuration, besides having considerably reduced the working frequency of such an element, allowed also the irradiation of such a frequency with high efficiency and according to the needs required by the problem under examination.

We observe that the differences of the radiating element according to the invention with respect to what disclosed in paper [21] are:
  the non-uniformity of the distribution of the slabs in the direction of said lower edge;
  the disposition of the gaps of the most external square of the SRRs in such a way that, on the facing sides of two adjacent slabs, such gaps are rotated with respect to one another by 0°, or 90°, or 180°, or 270° with respect to an axis a orthogonal to said two slabs,
  The fact that the gap of at least two of said $N_{SSR}$ SSR squares are rotated by an angle different from 180°.

Moreover, although of less importance, a further difference is the uniform or non-uniform protrusion of the slabs from the lower edge of said mouth. The non-uniform protrusion refers to the fact that the two external slabs protrudes more than the internal ones.

Nowhere in the article [21] it is even only suggested such a disposition.

Moreover, one observes here that in the literature other are quoted of authors who have obtained very poor results with MNG meta-material guides, having narrow band and efficiency of the order of 1% and a negative gain [22].

The use of the innovating system according to the invention has moreover the undoubtful advantage represented by the simplification is of the processes of test and maintainability of the active phased array antenna system and, therefore, a reduction of the internal and external time to market. This comes out to be particularly important when the active antennae are composed by some thousands of TX/RX modules, because the monitoring realized according to the invention allows to control accurately the status of the whole antenna.

It is to be stressed that the use of a transmission frequency of the radio link that is "far" from the active frequency of the system allows not to influence the functioning during the operations of diagnosis and test. Moreover, the possibility of disposing of a test and control system which avoids the use of additional physical connections, and does not compel the operator to execute complicated measurement operations and does not provide for the use of particular laboratories equipment with test-specific tools located in unstable positions, has a high positive consequence on the accessibility and maintenance of the apparatus; it is indeed to be considered that the antenna under consideration are placed on masts at tens of meters of height and rotate with a speed between 1 and 60 rpm.

The above-mentioned article of RUI YANG, YONGJUN XIE, XIADONG YANG, RUI 1-16 WANG, BOTAO CHEN ("fundamental modal properties of SRR metamaterials and metamaterial based waveguiding structures", OPTICS EXPRESS, vol. 17, no. 8, 31 Mar. 2009 (2009-03-31), pages 6101-61172) refers to a bi-anisotropic structure: SRR with different orientations are utilized, even on two orthogonal planes; the present invention utilizes, instead, a mono-anisotropic structure. What is more important is that the paper exclusively refers to the propagation within the waveguide and not to the irradiation into the space.

The above-mentioned article of ERENTOK A ET AL. ("Characterization of a 1-16 Volumetric Meta-material Realization of an Artificial Magnetic Conductor for Antenna Applications", IEEE TRANSACTIONS ON ANTENNAS AND PROPAGATION, IEEE SERVICE CENTER, PISCATAWAY, N.J., US, vol. 53, no. 1, 1 Jan. 2005 (2005-01-01), pages 160-172) refers to a MTM structure of the volumetric type as realized with elements different from those utilized in the present invention (which is not a volumetric structure). The disclosed structure is designed to realize a reflecting plane of the magnetic artificial (AMC) type to be used in front of a radiating element of the dipolar type. Hence, the use and the disclosed solution have nothing to do with the present invention and do not help widening the irradiation band.

The above-mentioned article of Z. X. XU, W. G. LIN ("controllable 1-16 absorbing structure of meta-material at microwave", THE INSTITUTION OF ENGINEERING AND TECHNOLOGY, vol. 69, 2008,-2008, pages 117-125, 4) refers to a type of application different from and without correlation with the present invention. Indeed, the MTM structure, though using concentric SRRs (however only two ones), comprises pin diodes and wires suitable to achieve results very different from those of the present invention, without even mentioning the widening of the irradiation band.

Finally, the above-mentioned article of J. J. BARROSO, P. J. CASTRO, J. P. LEITE 1-16 NETO ("experiments on wave propagation at 6.0 GHz in a left-handed waveguide", MICROWAVE AND OPTICAL TECHNOLOGY LETTERS, vol. 52, no. 10, October 2010) describes the use of a SSR array within a waveguide to obtain a lowering of the cut-off frequency, but does not propose any solution to widen the irradiation band and does not mention any irradiation from the waveguide, but only within it.

In general, the proposed approach is applicable to the control of the AESA ("Active Electronically Scanned Antenna") systems which represent almost the totality of the new and future radar products for the terrestrial, naval, avionic, space and missile applications.

The proposed approach is more in general applicable to all the RF moving systems, designed to operate at specific frequency bands, for which the radio-electrical and mechanical constraints hinder the fulfillment of the diagnosis and test requirements without invasive approaches.

The solutions subject matter of the present invention can be applied also in fields different from that of the radar antennae, in particular in all those test systems relevant to system constituted by a plurality of modules effecting elementary functions, and interconnected with this signals, data and controls distribution network, the test systems being subjected to the following constraints:

Each module can be provided with dedicated test and measurement connections, because of the dimensional constraints of the single module;

The amount of the same arguments leads to a test network, comparable, with respect to complexity, to the operative signals distribution network;

It is necessary to detect the ambient quantities in which the module operates (temperature, humidity, vibration);

The system has to be subjected to test and measurement in the operative conditions; therefore it is not possible to connect it to laboratory equipments;

The system is in roto-translational movement or is moving into of the platform using it.

By way of mere example, which is not intended to exhaust all the possibilities, one can think to the test of a sensors network, both RF and IR and in the visible, located on the surface of a vehicle, be it avionic or on tracks, or submarine, or to a test of an array antenna placed in the container fixed under an airplane wing.

Bibliography

[1] D.A.R.P.A Defense Science Office, "Metamaterials" August 2005 www.darpa.mil/dso/thrust*matdev/metamat.htm

[2] T. Itoth, A. A. Oliner, "Guest editorial", IEEE Transactions on Microwave Teory and Techniques, vol. 53, p. 1413-1417. April 2005.

[3] N. Engheta, R. W. Ziolkowski, "Introduction to the Special Issue on Metamaterials", IEEE Transaction on Antennas and Propagation, vol. 51, p. 2546-2549. October 2003.

[4] G. Veselago, "The electrodynamics of substance with simultaneously negative values of $\epsilon$ and $\mu$", Usp. Fiz. Nauk, vol. 92, p. 517-526. July 1967.

[5] G. Veselago, "The electrodynamics of substance with simultaneously negative values of $\epsilon$ and $\mu$", Soviet Physics-Uspekhi, vol. 10, p. 509-514, January-February 1968.

[6] J. B. Pendry, A. J. Holden, D. J. Robbins, W. J. Stewart, "Magnetism from conductors and enhanced nonlinear phenomena", IEEE Transaction on Microwave Theory and Techniques, vol. 47, no. 11, pp. 2075-2084. November 1999.

[7] J. B. Pendry, "Negative refraction makes a perfect lens", Physical Review Letters, vol. 85, pp. 3966-3969. 2000.

[8] D. R. Smith, W. J. Padilla, D. C. Vier, S. C. Nemat Nasser, S. Schultz, "Composite Medium with Simultaneously Negative Permeability and Permittivity", Phisical Review Letter, vol. 84, no. 18, p. 4184-4187. 1 May 2000.

[9] L. Lubkowski, C. Damm, B. Bandlow, R. Schuhmann, M. Schübler, T. Weiland, "Broadband trasmission below the cutoff frequency of a waveguide loaded with resonant scatterer arrays", IET Microwave Antennas Propagation, vol. 1, no. 1, p. 165-169, 2007.

[10] R. Marqués, J. Martel, F. Mesa, F. Medina, "Left-Handed Simulation and Trasmission of EM Waves in Subwavelength Split-Ring Resonator-Loaded Metallic Waveguides", Physical Review Letters, vol. 89, no. 18, p. 183901_1-183901_4. 28 October 2002.

[11] S. Hrabar, G. Jankovic, "Experimental Investigation of Radiation Properties of Waveguide filled with Uniaxial Single Negative Metamaterials"—*Antennas and Propagation Society International Symposium* 2006, *IEEE*, Page (s): 475-478

[12] G. Schettini, "Dispense del corso di Guide Elettromagnetiche".

[13] A. De Luca, "Fondamenti di teoria delle antenne e tecniche di misura".

[14] F. Bilotti, "Dispense del corso Antenne per Telecomunicazioni".

[15] S. Hrabar, J. Bartolic, Z. Sipus, "Waveguide Miniaturization Using Uniaxial Negative Permeability Metamaterial", IEEE Transactions on Antennas and Propagation, vol. 53, no. 1, p. 110-119, January 2005

[16] M. Lapine, S. Tretyakov, "Contemporary notes on metamaterials", Special Issue on Metamaterial LHM, IET Microwave Antennas Propagation, vol. 1, no. 1, p. 3-11. February 2007.

[17] S. Hrabar, D. Zaluski, I. Paskovic, "Direct verification of backward-wave propagation in subwavelength waveguide filled with split-ring resonators", EuCap 2007, the second European conference on Antennas and Propagation 2007, p. 1-4.

[18] "Metamaterials, Physics and Engineering Explorations", editors: Nader Engheta, Richard W. Ziolkowski, 2006.

[19] T. Itoth, A. A. Oliner, eds., Special Issue on Metamaterials Structures, Phenomena and Applications, IEEE Transactions on Microwave Teory and Techniques, vol. 53. April 2005.

[20] R. Marcon, "Oscillazioni e onde", CISU, vol. 1. 2003.

[21] M. Cicolani, A. De Luca, G. Schettini, M. Teglia, "A new approach for an embedded Wi-Fi controller in a C band phased array antenna" Proceedings of the 39th European Microwave Conference, p.1263, 29 Sep.-1 Oct. 2009, Rome, Italy;

[22] Silvio Hrabar, Goran Jankovic, "Experimental investigation of radiation properties of waveguides filled with uniaxial single negative metamaterials" ICEcom 2005 18$^{th}$ International Conference on Applied Electromagnetics and Communications, 2005, p. 1-4.

Aspects of the present invention have been above described and some modifications of this invention have been suggested, but it should be understood that those skilled in the art can make variations and changes, without so departing from the related scope of protection, as defined by the following claims.

The invention claimed is:

1. A waveguide radiating element having a working frequency that is tunable below a cut-off frequency, the waveguide radiating element comprising a rectangular tube presenting a longitudinal axis and a rectangular mouth on a plane perpendicular to the longitudinal axis;
the rectangular mouth comprising an upper edge and a lower edge, as well as lateral edges; and
the rectangular tube being partially filled with a MNG meta-material comprised of a number $N_l$ of dielectric slabs disposed on parallel planes that are spaced-apart, the number $N_l$ of dielectric slabs being a positive integer number >2,
the parallel planes being incident on said lower edge of said mouth,
each of the number of $N_l$ dielectric slabs having engraved on each of their faces a number $N_{SSR}$ of concentric Split Ring Resonator ("SSR") squares,
each of the number $N_{SSR}$ of concentric SRR squares presenting a gap on one of its sides, and
the number $N_{SSR}$ of concentric SRR squares being a positive integer value ≥1,
wherein:
a supply pin has a height $h_p$;
a distance $d_l$ between at least one pair of consecutive slabs of the number $N_l$ of dielectric slabs is non-uniform along a direction of said lower edge;
the number $N_{SSR}$ of SSR squares present an arrangement of the gaps of an outmost square in such a way that, on facing sides of two adjacent slabs, the gaps are rotated with respect to each other, said gaps being rotated at an angle of 0°, or 90°, or 180°, or 270° with respect to an axis α orthogonal to said two adjacent slabs, and the gaps of at least two of said number $N_{SSR}$ of SSR squares are rotated at an angle different from 180°; and
the working frequency of the waveguide radiating element is a function of $N_l$, $d_l$, $h_p$, $N_{SSR}$.

2. The waveguide radiating element according to claim 1, wherein the working frequency is the Wi-Fi band.

3. The waveguide radiating element according to claim 2, wherein each of the number $N_l$ of dielectric slabs protrudes from the lower edge of said mouth towards an outside of said mouth, in the direction of said longitudinal axis, by a distance s between 1.5 and 4.0 mm.

4. The waveguide radiating element according to claim 1, wherein $N_{SSR}$=3.

5. The waveguide radiating element according to claim 1, wherein $N_l$≥5.

6. The waveguide radiating element according to claim 5, wherein said number $N_l$ of dielectric slabs comprises:
a number of outmost slabs along the direction of said lower edge, and
one or more internal slabs between said number of outmost slabs,
wherein said number of outmost slabs protrude from said lower edge towards outside to an extent larger than that of said internal slabs.

7. The radiating element according to claim 6, wherein said distance $d_l$ has a value $d_{l1}$ between 1.2 and 1.7 mm for said one or more internal slabs and a value $d_{l2}$ between 1.5 and 4.5 mm between one or more most external slabs of said one or more internal slabs and said number of outmost slabs.

8. The radiating element according to claim 1, wherein $h_p$ is between 8 and 10 mm.

9. The waveguide radiating element according to claim 1, wherein a central frequency of the working frequency is inversely proportional to $h_p$, $d_l$, $N_l$, $N_{SSR}$.

10. The waveguide radiating element according to claim 1, wherein said distance $d_l$ is, for each pair of the consecutive slabs, equal to or a multiple of a pre-determined basic distance.

11. The radiating element according to claim 1, wherein said number $N_l$ of dielectric slabs are disposed on planes transversal to the direction of said lower edge.

12. The radiating element according to claim 1, wherein a fundamental mode corresponding to the working frequency is excited by means of a guide-cable transition using a coaxial connector that is orthogonal to the waveguide radiating element, or by means of a guide-cable transition with a coaxial connector along the longitudinal axis of the waveguide radiating element and flush to a central slab of said number $N_l$ of dielectric slabs, and with the supply pin closed towards earth.

13. A system for measuring programming and control parameters of a phased array antenna constituted by a plurality of transmitting-receiving modules ("TRM") modules, wherein the system uses one or more test TRM modules, each of the TRM modules comprising a waveguide radiating element that transmits signals relevant to programming and control antenna parameters, the signals being relevant to the presence and intensity of the radio-frequency, bus and control, supply voltage and temperature, the waveguide radiating element emitting outside the antenna's band, said one or more test TRM modules being installed in place of a corresponding subset of said plurality of TRM modules of the phased array antenna, the system comprising:
means for receiving signals from said one or more test TRM modules, and
means for the transmission of said signals to an electronic elaboration unit, wherein:
the waveguide radiating elements of said one or more test TRM modules are waveguide radiating elements having a working frequency that is tunable below a cut-off frequency, each of the waveguide radiating elements comprising:
a rectangular tube presenting a longitudinal axis and a rectangular mouth on a plane perpendicular to the longitudinal axis;
the rectangular mouth comprising an upper edge and a lower edge, as well as lateral edges; and
the rectangular tube being partially filled with a MNG meta-material comprised of a number $N_l$ of dielectric slabs disposed on parallel planes that are spaced-apart, the number $N_l$ of dielectric slabs being a positive integer number >2,
the parallel planes being incident on said lower edge of said mouth,
each of the number of $N_l$ dielectric slabs having engraved on each of their faces a number $N_{SSR}$ of concentric Split Ring Resonator ("SSR") squares,
each of the number $N_{SSR}$ of concentric SRR squares presenting a gap on one of its sides, and
the number $N_{SSR}$ of concentric SRR squares being a positive integer value $\geq 1$, wherein:
a supply pin has a height $h_p$;
a distance $d_l$ between at least one pair of consecutive slabs of the number $N_l$ of dielectric slabs is non-uniform along a direction of said lower edge;
the number $N_{SSR}$ of SSR squares present an arrangement of the gaps of an outmost square in such a way that, on facing sides of two adjacent slabs, the gaps are rotated with respect to each other, said gaps being rotated at an angle of 0°, or 90°, or 180°, or 270° with respect to an axis a orthogonal to said two adjacent slabs, and the gaps of at least two of said number $N_{SSR}$ of SSR squares are rotated at another angle different from 180°; and
the working frequency of the waveguide radiating element is a function of $N_l$, $d_l$, $h_p$, $N_{SSR}$.

14. The system according to claim 13, wherein said means for receiving signals comprises a receiving element placed on a mechanical arm that is integral to the rotating part of the phased array antenna, said rotating part being a calibration probe of the phased array antenna.

15. The system according to claim 14, wherein said means for receiving signals comprises one or more fixed stations distributed on a round angle around the phased array antenna, each of the one or more fixed stations comprising a receiving element.

* * * * *